(12) United States Patent
Agarwal et al.

(10) Patent No.: US 8,933,824 B1
(45) Date of Patent: Jan. 13, 2015

(54) HARDWARE DECOMPRESSION OF DEFLATE ENCODED DATA WITH MULTIPLE BLOCKS

(71) Applicant: International Business Machines Corporation, Armonk, NY (US)

(72) Inventors: Kanak B. Agarwal, Austin, TX (US); Damir A. Jamsek, Austin, TX (US); Andrew K. Martin, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/012,452

(22) Filed: Aug. 28, 2013

(51) Int. Cl.
H03M 7/34 (2006.01)
G06F 9/30 (2006.01)

(52) U.S. Cl.
CPC .................................. G06F 9/3016 (2013.01)
USPC ................................................ 341/51; 341/50

(58) Field of Classification Search
CPC ... H03M 7/30; H03M 7/3084; H03M 7/3086; H03M 7/3088
USPC ..................................................... 341/50–51
See application file for complete search history.

(56) References Cited

U.S. PATENT DOCUMENTS

| 5,051,745 | A | 9/1991 | Katz |
| 5,440,753 | A | 8/1995 | Hou et al. |
| 5,461,679 | A | 10/1995 | Normile et al. |
| 5,506,580 | A | 4/1996 | Whiting et al. |
| 5,890,006 | A | 3/1999 | Tran et al. |
| 5,963,154 | A | 10/1999 | Wise et al. |
| 6,061,775 | A | 5/2000 | Tran et al. |
| 6,215,424 | B1 | 4/2001 | Cooper |
| 6,219,457 | B1 | 4/2001 | Potu |
| 6,310,563 | B1 | 10/2001 | Har et al. |
| 6,489,902 | B2 * | 12/2002 | Heath .............................. 341/87 |
| 6,657,565 | B2 * | 12/2003 | Kampf ............................ 341/51 |
| 6,693,567 | B2 | 2/2004 | Cockburn et al. |
| 6,732,198 | B1 | 5/2004 | Johnson et al. |
| 6,781,529 | B1 | 8/2004 | Lin et al. |
| 6,822,589 | B1 | 11/2004 | Dye et al. |
| 6,865,668 | B1 | 3/2005 | Benes et al. |
| 6,944,751 | B2 | 9/2005 | Fetzer et al. |
| 7,180,433 | B1 | 2/2007 | Grotmol |
| 7,233,265 | B2 | 6/2007 | Cockburn et al. |

(Continued)

FOREIGN PATENT DOCUMENTS

| EP | 0877320 | 4/1998 |
| EP | 0891089 | 1/1999 |
| WO | 2009134932 | 11/2009 |

OTHER PUBLICATIONS

Office Action for U.S. Appl. No. 13/313,072, U.S. Patent and Trademark Office, mailed May 13, 2013, 16 pages.

(Continued)

Primary Examiner — Khai M Nguyen
(74) Attorney, Agent, or Firm — VanLeeuwen & VanLeeuwen; William J. Stock

(57) ABSTRACT

An approach is provided in which in which a decoder pipeline receives a data stream that includes a stream of deflate blocks. The decoder pipeline decodes an end of block symbol included in one of the deflate blocks and identifies a recycle point in the data stream in response to decoding the end of block symbol. In turn, the decoder pipeline recycles pipeline data residing between the end of block symbol and the recycle point.

20 Claims, 5 Drawing Sheets

(56) References Cited

U.S. PATENT DOCUMENTS

| | | |
|---|---|---|
| 7,305,542 B2 | 12/2007 | Madduri |
| 7,439,883 B1 | 10/2008 | Moni et al. |
| 7,453,377 B2 * | 11/2008 | Lee et al. ............... 341/51 |
| 7,492,290 B1 | 2/2009 | Schneider |
| 7,500,103 B2 | 3/2009 | Cockburn et al. |
| 7,640,417 B2 | 12/2009 | Madduri |
| 7,681,013 B1 | 3/2010 | Trivedi et al. |
| 7,817,069 B2 | 10/2010 | Schneider |
| 7,872,598 B2 | 1/2011 | Baktir et al. |
| 8,013,762 B2 | 9/2011 | Matthews et al. |
| 8,125,357 B1 * | 2/2012 | Hamlet et al. ............ 341/51 |
| 8,244,911 B2 | 8/2012 | Bass et al. |
| 8,325,069 B2 | 12/2012 | Gopal et al. |
| 2003/0091242 A1 | 5/2003 | Kakarala et al. |
| 2003/0163672 A1 | 8/2003 | Fetzer et al. |
| 2003/0185305 A1 | 10/2003 | Macinnis et al. |
| 2003/0236964 A1 | 12/2003 | Madduri |
| 2004/0028141 A1 | 2/2004 | Hsiun et al. |
| 2004/0116143 A1 | 6/2004 | Love et al. |
| 2004/0120404 A1 | 6/2004 | Sugahara et al. |
| 2004/0221143 A1 | 11/2004 | Wise et al. |
| 2004/0264696 A1 | 12/2004 | Cockburn et al. |
| 2005/0128109 A1 | 6/2005 | Sane et al. |
| 2005/0169364 A1 | 8/2005 | Singh |
| 2006/0291560 A1 | 12/2006 | Penna et al. |
| 2007/0113222 A1 | 5/2007 | Diqnum et al. |
| 2007/0174588 A1 | 7/2007 | Fuin |
| 2008/0022074 A1 | 1/2008 | Madduri |
| 2008/0198047 A1 | 8/2008 | Niemi et al. |
| 2008/0232461 A1 | 9/2008 | Dachiku |
| 2009/0006510 A1 | 1/2009 | Laker et al. |
| 2009/0220009 A1 | 9/2009 | Tomita et al. |
| 2010/0020825 A1 | 1/2010 | Bass et al. |
| 2010/0141488 A1 | 6/2010 | Baktir et al. |
| 2011/0208833 A1 | 8/2011 | Fallon |
| 2011/0280314 A1 | 11/2011 | Sankaran et al. |
| 2013/0103695 A1 | 4/2013 | Rarrick et al. |
| 2013/0147644 A1 | 6/2013 | Agarwal et al. |
| 2013/0148745 A1 | 6/2013 | Agarwal et al. |

OTHER PUBLICATIONS

Office Action for U.S. Appl. No. 13/313,072, U.S Patent and Trademark Office, mailed Dec. 31, 2013, 16 pages.

Office Action for U.S. Appl. No. 13/555,547, U.S. Patent and Trademark Office, mailed Jun. 4, 2013, 14 pages.

Notice of Allowance for U.S. Appl. No. 13/555,547, U.S. Patent and Trademark Office, mailed Jan. 2, 2014, 14 pages.

Deutsch, "DEFLATE Compressed Data Format Specification version 1.3," Network Working Group RFC 1951, May 1996, 25 pages.

Lee et al., "Token-Ring Reservation Enhancer for Early Token Release," IBM Technical Disclosure Bulletin, vol. 33, No. 7, IPCOMM000102647D, Dec. 1, 1990, 6 pages.

Moertl et al., "Direct Access Storage Device Compression and Decompression Data Flow," IBM Technical Disclosure Bulletin, vol. 38, No. 11, IPCOM000116855D, Nov. 1, 1995, 5 pages.

Blanco et al., "Dynamic Random Access Memory Refresh Method in Triple-Modular-Redundant System," IBM Technical Disclosure Bulletin, Jul. 1, 1993, vol. 36, No. 07, pp. 7-12.

Burger et al., "A Session Initiation Protocol (SIP) Event Package for Key Press Stimulus (KPML)," Internet Society, Standards Track, Request for Comments 4730, Nov. 1, 2006, 58 pages.

Surtees et al., "Signaling Compression (SigComp) User's Guide," Internet Society, ip.com, IPCOM000136745D, May 1, 2006, 45 pages.

ASPRS Board, "LAS Specification Version 1.2," ASPRS Board Meeting, Sep. 2, 2008, 13 pages.

Pereira, "IP Payload Compression Using DEFLATE," Internet Society, ip.com, IPCOM000002967D, Dec. 1, 1998, 6 pages.

Deutsch et al, "ZLIB Compressed Data Format Specification Version 3.3," Internet Society, ip.com, IPCOM000004248D, May 1, 1996, 13 pages.

* cited by examiner

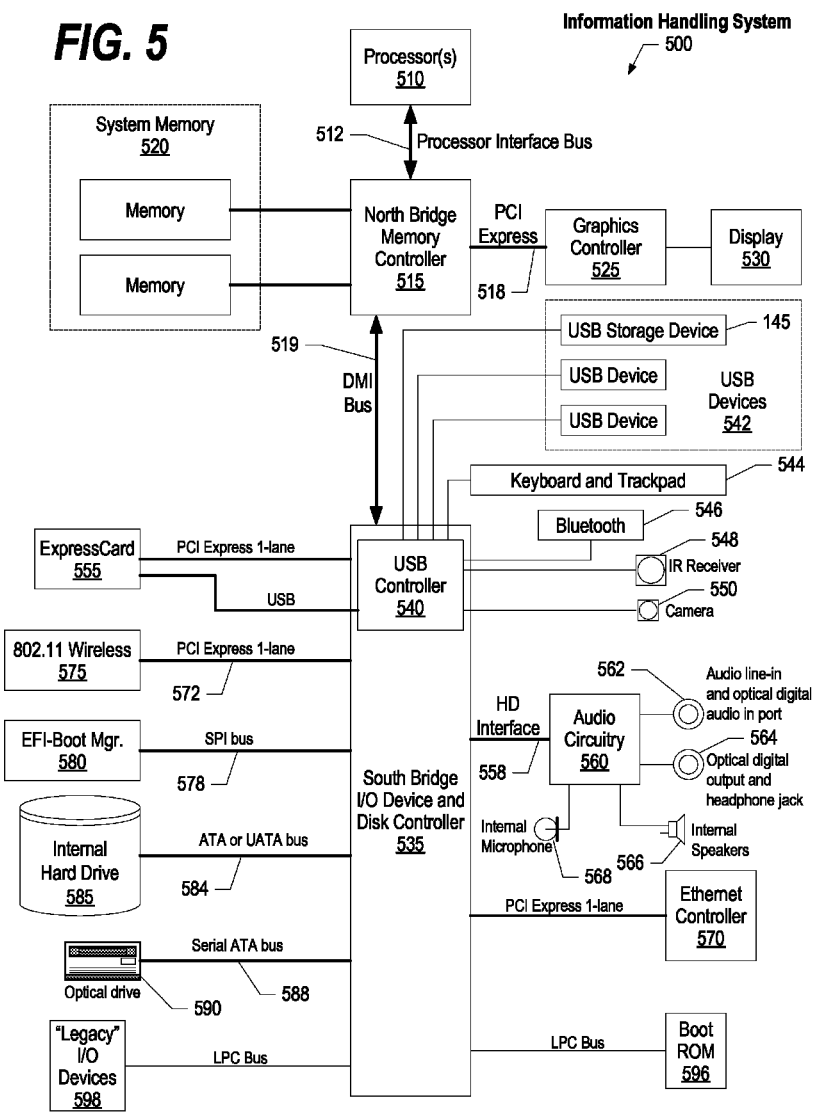

HARDWARE DECOMPRESSION OF DEFLATE ENCODED DATA WITH MULTIPLE BLOCKS

BACKGROUND

The present disclosure relates to hardware decompression of an encoded data stream that includes multiple deflate blocks. More particularly, the present disclose relates to recycling encoded data through a decoder pipeline after detecting deflate block end of block symbols.

Computer systems compress data for various reasons, such as to reduce storage requirements or to reduce bandwidth requirements when sending data over a computer network. One approach to compress data is referred to as "DEFLATE". Deflate is a data compression algorithm that uses a combination of an LZ77 algorithm and Huffman coding to compress data. Deflate data streams include a series of "deflate blocks." Each deflate block includes a header, Huffman encoded deflate elements, and a Huffman encoded end of block element. A deflate block's header includes information to configure a decompression engine that, in turn, decompresses each Huffman element included in the specific deflate block. Deflate blocks may be static deflate blocks (use static Huffman encoding), dynamic deflate blocks (includes a Huffman tree in the header), or non-compressed blocks with varying sizes.

BRIEF SUMMARY

According to one embodiment of the present disclosure, an approach is provided in which a decoder pipeline receives a data stream that includes a stream of deflate blocks. The decoder pipeline decodes an end of block symbol included in one of the deflate blocks and identifies a recycle point in the data stream in response to decoding the end of block symbol. In turn, the decoder pipeline recycles pipeline data residing between the end of block symbol and the recycle point.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present disclosure, as defined solely by the claims, will become apparent in the non-limiting detailed description set forth below.

BRIEF DESCRIPTION OF THE SEVERAL VIEWS OF THE DRAWINGS

The present disclosure may be better understood, and its numerous objects, features, and advantages made apparent to those skilled in the art by referencing the accompanying drawings, wherein:

FIG. 5 is a block diagram of a data processing system in which the methods described herein can be implemented.

DETAILED DESCRIPTION

Figure 1:
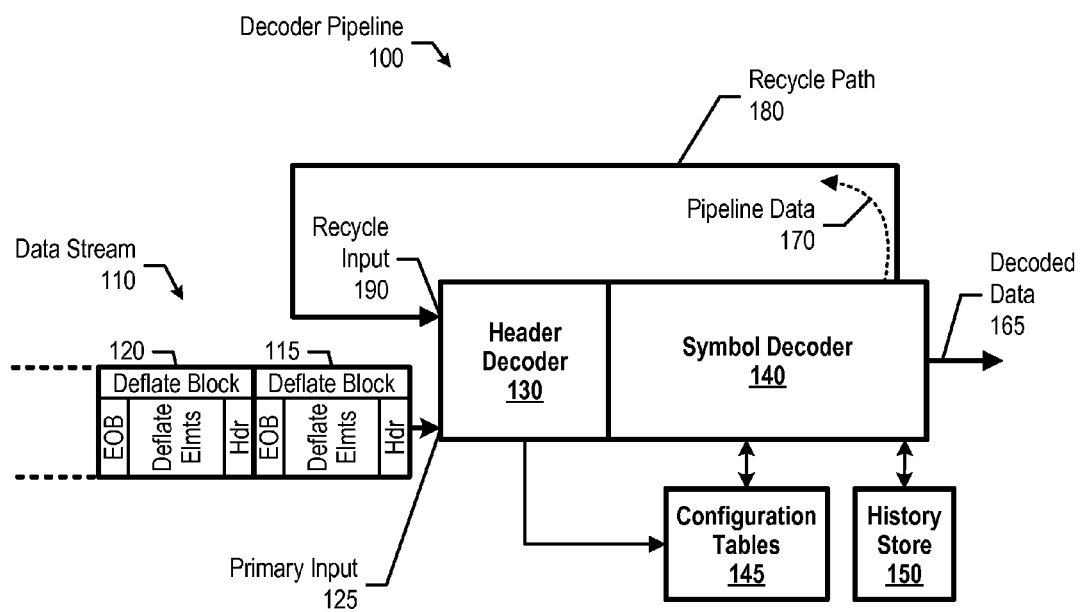
FIG. 1 is a diagram depicting one example of a decoder pipeline that recycles pipeline data in response to detecting and end of a deflate block.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The following detailed description will generally follow the summary of the disclosure, as set forth above, further explaining and expanding the definitions of the various aspects and embodiments of the disclosure as necessary.

FIG. 1 is a diagram depicting one example of a decoder pipeline that recycles pipeline data in response to detecting an end of a deflate block. Decoder pipeline 100 receives data stream 110 on primary input 125. Data stream 110 includes multiple deflate blocks (115 and 120) that are encoded according to a deflate compression algorithm. As such, deflate block 115's header (and a Huffman tree if applicable) includes configuration information to decode the deflate elements included in deflate block 115. Likewise, deflate block 120's header (includes Huffman tree if applicable) includes configuration information to decode the deflate elements included in deflate block 120.

Decoder pipeline 100 includes header decoder 130 and symbol decoder 140. Header decoder 130 decodes a deflate block's header, loads configuration information in configuration tables 145, and enters bypass mode. In turn, symbol decoder 140 decodes the decode block's deflate elements based upon the loaded configuration information (in configuration tables 145) and provides decoded data 165 for further processing. In one embodiment, symbol decoder 140 utilizes history data from history store 150 to decode particular deflate elements, such as those that include pointer symbols pointing to previously decoded data.

As discussed above, since each deflate block in data stream 110 includes a header with specific configuration information, symbol decoder 140 does not decode a deflate block's deflate elements until header decoder 130 decodes the corresponding deflate block's header and stores the configuration information in configuration tables 145. Decoder pipeline 100, however, does not recognize the end of a deflate block and the start of a new deflate block until symbol decoder 140 decodes the end of block symbol in the deflate block. For example, by the time symbol decoder 140 decodes deflate block 115's end of block symbol, all or a portion of deflate block 120 is loaded into decoder pipeline 100. In this example, deflate block 120's header was not decoded by header decoder 130 and, therefore, symbol decoder 140 is not able to decode deflate block 120's deflate elements correctly.

To resolve this issue, symbol decoder 140 uses recycle path 180 to recycle encoded data that resides in decoder pipeline (e.g., pipeline data 170) back to header decoder 130 (via recycle input 190) when symbol decoder 140 decodes an end of block symbol. As such, when symbol decoder 140 decodes deflate block 115's end of block symbol, symbol decoder 140 recycles deflate block 120 over recycle path 180 (see FIG. 2A and corresponding text for further details). When header decoder 130 detects recycled data 180 on recycle input 190, header decoder 130 switches to decode mode and decodes deflate block 120's header received on recycle input 190.

Figure 2A:
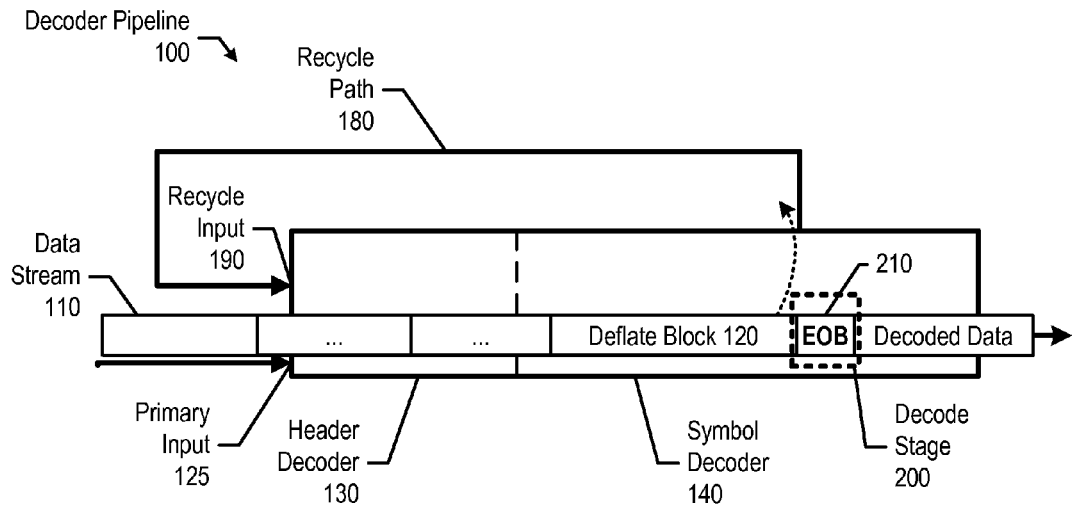
FIG. 2A is a diagram depicting one example of a decoder pipeline decoding an end of block symbol.
Figure 2B:
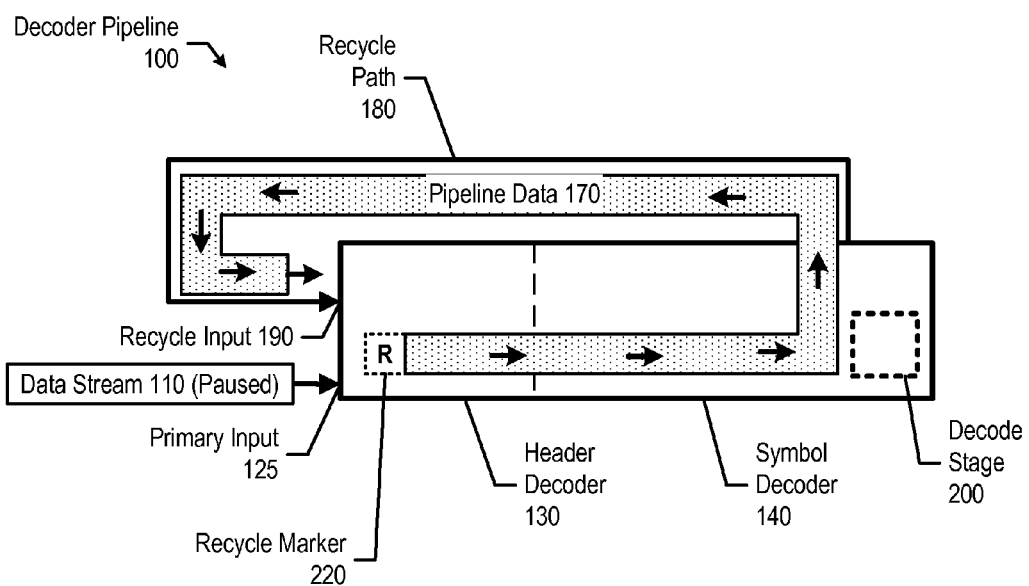
FIG. 2B is a diagram depicting one example of a header decoder detecting recycled pipeline data on a recycle path.

In addition, when header decoder 130 detects pipeline data 170 on recycle input 190, header decoder 130 pauses data stream 110 on primary input 125 and identifies a recycle point (e.g., end of the data stream to recycle) in the data stream entering decoder pipeline 100 (see FIG. 2B and corresponding text for further details). As discussed in embodiments below, header decoder 130 inserts a recycle marker at the recycle point. However, as those skilled in the art can appreciate, decoder pipeline 100 may use other approaches to identify and track the recycle point, such as counting a number of bits in the pipeline to recycle.

Figure 3A:
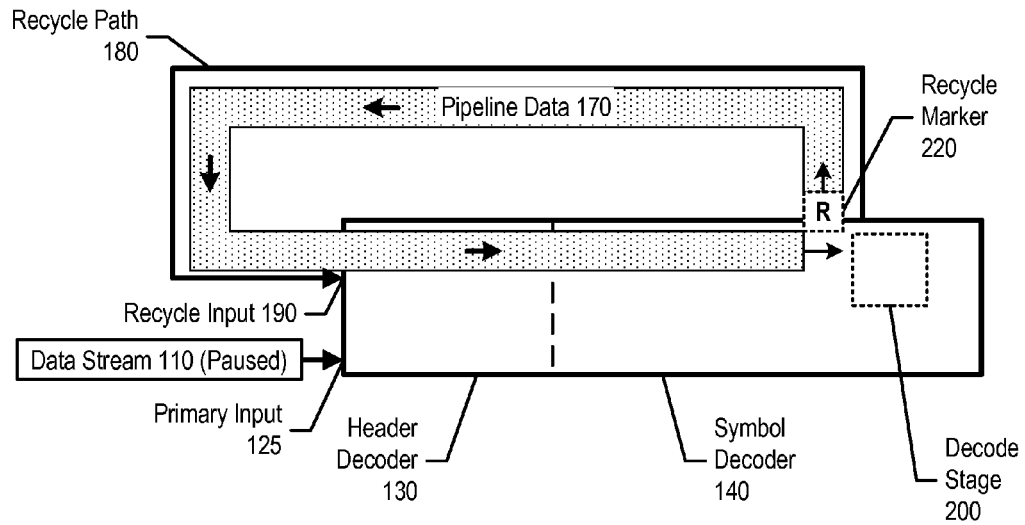
FIG. 3A is a diagram depicting one example of a symbol decoder completing pipeline data recycling and re-commencing data decoding.

Symbol decoder 140 continues to recycle pipeline data 170 on recycle path 180 until symbol decoder 140 detects the recycle point/recycle marker (end of pipeline data 170), at which point symbol decoder 140 stops recycling data and passes the received data onto the next stage in symbol decoder 140 (see FIG. 3A and corresponding text for further details). Likewise, when header decoder 130 detects the recycle point/recycle marker in pipeline data 170 on recycle path 180 (indicating the end of recycled data 170), header decoder 130 resumes receiving data stream 110 on primary input 125 (see FIG. 3B and corresponding text for further details).

FIG. 2A is a diagram depicting one example of a decoder pipeline decoding an end of block symbol. FIG. 2A shows decode stage 200 (included in symbol decoder 140) decoding end of block symbol 210 that, for explanation purposes, may be deflate block 115's end of block symbol. As discussed earlier, since deflate block 120's header has not yet been decoded by header decoder 130, symbol decoder 140 begins recycling deflate block 120 (pipeline data 170) back to header decoder 130 via recycle path 180. In turn, when header decoder 130 detects recycled data on recycle input 190, header decoder 130 inserts a recycle marker in the data stream being processed by decoder pipeline 100 (see FIG. 2B and corresponding text for further details).

FIG. 2B is a diagram depicting one example of a header decoder detecting pipeline data on a recycle path. Symbol decoder 140 began recycling pipeline data 170 when decode stage 200 decoded deflate block 115's end of block symbol (shown in FIG. 2A). As can be seen, decode stage 200 is not decoding data while symbol decoder 140 recycles data. When header decoder 130 detects pipeline data 170 on recycle input 190, header decoder 130 inserts recycle marker 220 into the data entering decoder pipeline 100. In addition, header decoder 130 pauses data stream 110 on primary input 125 and begins to decode pipeline data 170, which starts with decoding deflate block 120's header. As such, header decoder 130 continues to decode pipeline data 170 until the header is decoded (enters bypass mode) or pipeline data 170 ends, at which point header decoder 130 resumes processing data stream 110 on primary input 125 (see FIGS. 3A, 3B, and corresponding text for further details).

FIG. 3A is a diagram depicting one example of a symbol decoder completing pipeline data recycling and re-commencing data decoding. When header decoder 130 decodes deflate block 120's header at the start of pipeline data 170 received on recycle path 190 (from FIG. 2B), header decoder 130 configures configuration tables 145 to decode deflate block 120's deflate elements. As such, when symbol decoder 140 detects recycle marker 220, indicating the end of pipeline data 170 to recycle, symbol decoder 140 stops recycling the data and passes the subsequent data to decode stage 200 (e.g., the first deflate element included in deflate block 120). In turn, decode stage 200 decodes data 170 according to the new configuration table parameters (see FIG. 3B and corresponding text for further details).

Figure 3B:
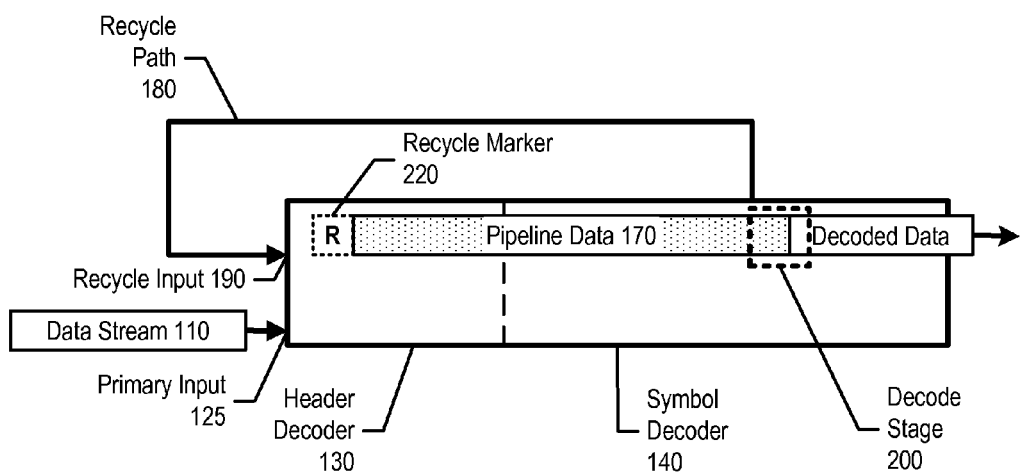
FIG. 3B is a diagram depicting one example of a header decoder detecting a recycle marker and resuming data stream processing on a primary input.

FIG. 3B is a diagram depicting one example of a header decoder detecting a recycle marker at the end of recycled pipeline data 170 and resuming data stream processing on a primary input. When header decoder 130 detects recycle marker 220 on recycle input 190 (indicating the end of pipeline data 170 recycling), header decoder 130 resumes processing of data stream 110 on primary input 140. Decoder pipeline 100 maintains this state until decode stage 200 decodes the next end of block symbol (e.g., deflate block 120's end of block symbol), at which point symbol decoder 140 re-enters the recycle pipeline data stage to recycle data included in decoder pipeline 100 (see FIGS. 2A, 4 and corresponding text for further details).

Figure 4:
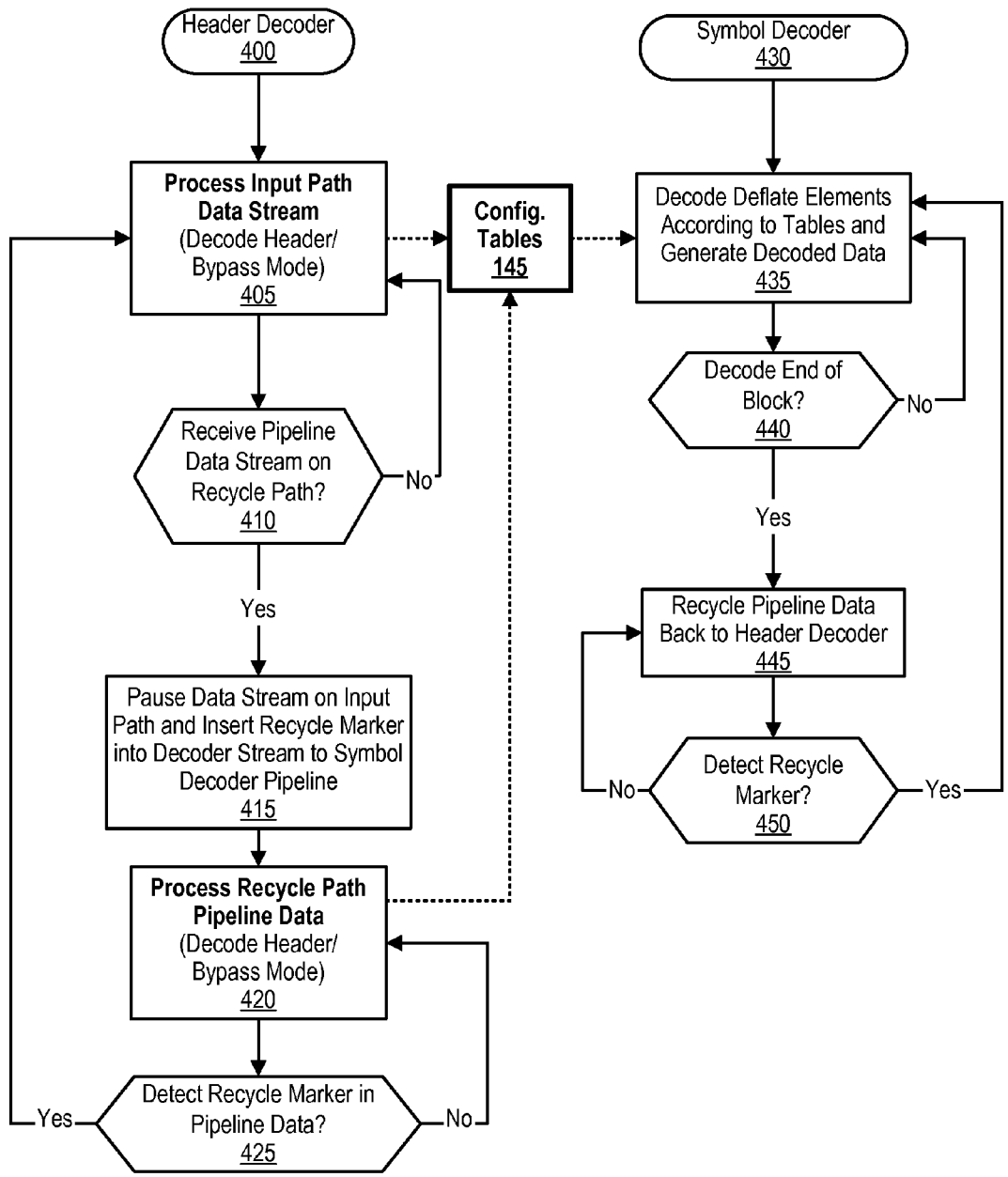
FIG. 4 is a flowchart showing one example of steps taken by a decoder pipeline to recycle pipeline data.

FIG. 4 is a flowchart showing one example of steps taken by a decoder pipeline to recycle encoded data on a decoder pipeline. Header decoder processing commences at 400, whereupon the header decoder processes a data stream received on primary input 125. The header decoder decodes a deflate block's header and configures configuration tables according to the header decoding. For example, the header may indicate a static deflate block, or the header may indicate a dynamic deflate block, in which case the header decoder also decodes a corresponding Huffman tree included in the deflate block and configures configuration tables 145 accordingly.

Once the header decoder decodes the header (and a Huffman tree if applicable), the header decoder enters bypass mode and passes the data stream to the symbol decoder. Symbol decoder processing commences at 430, whereupon the symbol decoder decodes deflate elements included in the data stream according to the configuration table information stored in configuration tables 145.

The symbol decoder determines whether an end of block symbol in the data stream has been decoded, indicating the end of the deflate block (decision 440). If not, decision 440 branches to the "No" branch to continue decoding the deflate elements included in the deflate block. This looping continues until the symbol decoder decodes the decode block's end of block symbol, at which point decision 440 branches to the "Yes" branch. At this point, the symbol decoder begins recycling data residing in decoder pipeline 100 (pipeline data 170) back to the header decoder via recycle path 180 (see FIG. 2A and corresponding text for further details).

Referring back to the header decoder, up to this point the header decoder has been in bypass mode (405) and has been monitoring recycle path 180 for recycled pipeline data (decision 410, "No" branch). When the header decoder detects the pipeline data on recycle input 190, decision 410 branches to the "Yes" branch, whereupon the header decoder pauses primary input 125's data stream 210 and inserts a recycle marker (220 shown in FIG. 2B) in the data stream being fed to the symbol decoder (415). In turn, the header decoder processes pipeline data 170 received over recycle path 180 (420). Depending upon the amount of recycled data, the header decoder begins decoding the header of the next deflate block, which may include storing new configuration table information in configuration tables 145.

In one embodiment, the header decoder may not add a recycle marker into the data stream if the data stream has already ended, in which case the header decoder already included a stream end indicator into the data stream. In this embodiment, the symbol decoder recycles the pipeline data until the stream end indicator. The header decoder processes the recycled pipeline data (decodes header) and sends the remaining recycled pipeline data back to the symbol decoder along with the stream end signal.

Referring back to the symbol decoder, the symbol decoder continues recycling pipeline data 170 (decision 450, "No" branch, see FIG. 3A and corresponding text for further details) until the symbol decoder detects the recycle marker in the recycled data inserted by the header decoder, at which point decision 450 branches to the "Yes" branch, whereupon (after recycling the recycle marker back to the header decoder) the symbol decoder commences decoding the deflate elements in the next deflate block according to the new configuration information stored in configuration store 125.

Referring back to the header decoder at 420, the header decoder continues to process pipeline data 170 received from the symbol decoder (decision 425 "No" branch) until the header decoder detects the recycle marker at the end of pipeline data 170 (see FIG. 3B and corresponding text for further details), at which point decision 425 branches to the "Yes" branch, to resume processing the data stream on primary input 125.

FIG. 5 illustrates information handling system 500, which is a simplified example of a computer system capable of performing the computing operations described herein. Information handling system 500 includes one or more processors 510 coupled to processor interface bus 512. Processor interface bus 512 connects processors 510 to Northbridge 515, which is also known as the Memory Controller Hub (MCH). Northbridge 515 connects to system memory 520 and provides a means for processor(s) 510 to access the system memory. Graphics controller 525 also connects to Northbridge 515. In one embodiment, PCI Express bus 518 connects Northbridge 515 to graphics controller 525. Graphics controller 525 connects to display device 530, such as a computer monitor.

Northbridge 515 and Southbridge 535 connect to each other using bus 519. In one embodiment, the bus is a Direct Media Interface (DMI) bus that transfers data at high speeds in each direction between Northbridge 515 and Southbridge 535. In another embodiment, a Peripheral Component Interconnect (PCI) bus connects the Northbridge and the Southbridge. Southbridge 535, also known as the I/O Controller Hub (ICH) is a chip that generally implements capabilities that operate at slower speeds than the capabilities provided by the Northbridge. Southbridge 535 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 596 and "legacy" I/O devices (using a "super I/O" chip). The "legacy" I/O devices (598) can include, for example, serial and parallel ports, keyboard, mouse, and/or a floppy disk controller. The LPC bus also connects Southbridge 535 to Trusted Platform Module (TPM) 595. Other components often included in Southbridge 535 include a Direct Memory Access (DMA) controller, a Programmable Interrupt Controller (PIC), and a storage device controller, which connects Southbridge 535 to nonvolatile storage device 585, such as a hard disk drive, using bus 584.

ExpressCard 555 is a slot that connects hot-pluggable devices to the information handling system. ExpressCard 555 supports both PCI Express and USB connectivity as it connects to Southbridge 535 using both the Universal Serial Bus (USB) the PCI Express bus. Southbridge 535 includes USB Controller 540 that provides USB connectivity to devices that connect to the USB. These devices include webcam (camera) 550, infrared (IR) receiver 548, keyboard and trackpad 544, and Bluetooth device 546, which provides for wireless personal area networks (PANs). USB Controller 540 also provides USB connectivity to other miscellaneous USB connected devices 542, such as a mouse, removable nonvolatile storage device 545, modems, network cards, ISDN connectors, fax, printers, USB hubs, and many other types of USB connected devices. While removable nonvolatile storage device 545 is shown as a USB-connected device, removable nonvolatile storage device 545 could be connected using a different interface, such as a Firewire interface, etcetera.

Wireless Local Area Network (LAN) device 575 connects to Southbridge 535 via the PCI or PCI Express bus 572. LAN device 575 typically implements one of the IEEE 802.11 standards of over-the-air modulation techniques that all use the same protocol to wireless communicate between information handling system 500 and another computer system or device. Optical storage device 590 connects to Southbridge 535 using Serial ATA (SATA) bus 588. Serial ATA adapters and devices communicate over a high-speed serial link. The Serial ATA bus also connects Southbridge 535 to other forms of storage devices, such as hard disk drives. Audio circuitry 560, such as a sound card, connects to Southbridge 535 via bus 558. Audio circuitry 560 also provides functionality such as audio line-in and optical digital audio in port 562, optical digital output and headphone jack 564, internal speakers 566, and internal microphone 568. Ethernet controller 570 connects to Southbridge 535 using a bus, such as the PCI or PCI Express bus. Ethernet controller 570 connects information handling system 500 to a computer network, such as a Local Area Network (LAN), the Internet, and other public and private computer networks.

While FIG. 5 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

While particular embodiments of the present disclosure have been shown and described, it will be obvious to those skilled in the art that, based upon the teachings herein, that changes and modifications may be made without departing from this disclosure and its broader aspects. Therefore, the appended claims are to encompass within their scope all such changes and modifications as are within the true spirit and scope of this disclosure. Furthermore, it is to be understood that the disclosure is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; the same holds true for the use in the claims of definite articles.

The invention claimed is:

1. A computer-implemented method comprising:
   receiving a data stream on a first input corresponding to a decoder pipeline, wherein the data stream includes a plurality of deflate blocks;
   decoding, by the decoder pipeline, an end of block symbol included in a first deflate block included in the plurality of deflate blocks;
   identifying, by the decoder pipeline, a recycle point in the data stream in response to decoding the end of block symbol, wherein data residing between the end of block symbol and the recycle point is pipeline data; and
   recycling the pipeline data to a second input corresponding to the decoder pipeline.

2. The method of claim 1 wherein a symbol decoder included in the decoder pipeline decodes the end of block symbol, and wherein a header decoder included in the decoder pipeline identifies the recycle point in the data stream in response to detecting the recycled pipeline data at a recycle input.

3. The method of claim 2 wherein the header decoder inserts a recycle marker in the data stream at the identified recycle point.

4. The method of claim 2 further comprising:
   decoding a header included in the recycled pipeline data, by the header decoder, that corresponds to a second deflate block subsequent to the first deflate block in the data stream.

5. The method of claim 4 further comprising:
   configuring a configuration table, by the header decoder, in response to decoding the header of the second deflate block; and
   entering header decoder bypass mode, wherein the header decoder passes the recycled pipeline data subsequent to the header to the symbol decoder.

6. The method of claim 5 further comprising:
   receiving the recycled pipeline data at the symbol decoder from the header decoder;
   detecting, by the symbol decoder, the recycle point in the recycled pipeline data; and
   terminating, by the symbol decoder, the recycling of the pipeline data in response to detecting the recycle point.

7. The method of claim 2 further comprising:
   detecting, by the header decoder, the recycle point in the recycled pipeline data, indicating an end to the recycled pipeline data; and
   resuming processing, by the header decoder, of the data stream in response to detecting the recycle point in the recycled pipeline data.

8. The method of claim 1 wherein the plurality of deflate blocks are compressed according to a deflate compression algorithm that includes Huffman encoding, and wherein each of the plurality of deflate blocks are selected from the group consisting of a static deflate block, a dynamic deflate block, and a non-compressed block.

9. An information handling system comprising:
   one or more processors;
   a memory coupled to at least one of the processors; and
   a hardware decoder pipeline coupled to at least one of the processors, wherein the hardware decoder pipeline performs a set of actions comprising:
      receiving a data stream on a first input corresponding to the decoder pipeline, wherein the data stream includes a plurality of deflate blocks;
      decoding an end of block symbol included in a first deflate block included in the plurality of deflate blocks;
      identifying a recycle point in the data stream in response to decoding the end of block symbol, wherein data residing between the end of block symbol and the recycle point is pipeline data; and
      recycling the pipeline data to a second input corresponding to the decoder pipeline.

10. The information handling system of claim 9 further comprising:
    a symbol decoder included in the decoder pipeline that decodes the end of block symbol; and
    a header decoder included in the decoder pipeline that identifies the recycle point in the data stream in response to detecting the recycled pipeline data at a recycle input.

11. The information handling system of claim 10 wherein the header decoder inserts a recycle marker in the data stream at the identified recycle point.

12. The information handling system of claim 10 wherein the header decoder decodes a header included in the recycled pipeline data that corresponds to a second deflate block subsequent to the first deflate block in the data stream.

13. The information handling system of claim 12 wherein the set of actions performed by the header decoder further comprise:
    configuring a configuration table in response to decoding the header of the second deflate block; and
    entering header decoder bypass mode and passing the recycled pipeline data subsequent to the header to the symbol decoder.

14. The information handling system of claim 13 wherein the set of actions performed by the symbol decoder further comprise:
    receiving the recycled pipeline data from the header decoder;
    detecting the recycle point in the recycled pipeline data; and
    terminating the recycling of the pipeline data in response to detecting the recycle point.

15. The information handling system of claim 10 wherein the set of actions performed by the header decoder further comprise:
    detecting the recycle point in the recycled pipeline data, indicating an end to the recycled pipeline data; and
    resuming processing of the data stream in response to detecting the recycle point in the recycled pipeline data.

16. The information handling system of claim 9 wherein the plurality of deflate blocks are compressed according to a deflate compression algorithm that includes Huffman encoding, and wherein each of the plurality of deflate blocks are selected from the group consisting of a static deflate block, a dynamic deflate block, and a non-compressed block.

17. A computer program product stored in a computer readable storage medium, comprising computer program code that, when executed by an information handling system, causes the information handling system to perform actions comprising:
    receiving a data stream on a first input corresponding to a decoder pipeline, wherein the data stream includes a plurality of deflate blocks;
    decoding an end of block symbol included in a first deflate block included in the plurality of deflate blocks;
    identifying a recycle point in the data stream in response to decoding the end of block symbol, wherein data residing between the end of block symbol and the recycle point is pipeline data; and
    recycling the pipeline data to a second input corresponding to the decoder pipeline.

18. The computer program product of claim 17 wherein the information handling system performs further actions comprising insertion of a recycle marker in the data stream at the identified recycle point.

19. The computer program product of claim 17 wherein the information handling system performs further actions comprising:
   decoding a header included in the recycled pipeline data that corresponds to a second deflate block subsequent to the first deflate block in the data stream; and
   configuring a configuration table in response to decoding the header of the second deflate block.

20. The computer program product of claim 19 wherein the information handling system performs further actions comprising:
   detecting the recycle point in the recycled pipeline data, indicating an end to the recycled pipeline data; and
   resuming processing of the data stream in response to detecting the recycle point in the recycled pipeline data.

* * * * *